United States Patent [19]
Kennish et al.

[11] Patent Number: 5,604,333
[45] Date of Patent: Feb. 18, 1997

[54] PROCESS AND STRUCTURE FOR A SOLDER THIEF ON CIRCUIT BOARDS

[75] Inventors: Richard A. Kennish; Leslie S. Polaski, both of Beaverton, Oreg.

[73] Assignee: Intel Corporation, Santa Clara, Calif.

[21] Appl. No.: 347,820

[22] Filed: Nov. 30, 1994

[51] Int. Cl.⁶ .................................................. H05K 1/00
[52] U.S. Cl. .......................... 174/261; 174/262; 361/767; 361/760; 228/180.1
[58] Field of Search ............................ 361/767, 768, 361/774, 777, 760; 174/261, 262, 260, 250; 228/180.21, 180.22, 180.1, 189.1

[56] References Cited

U.S. PATENT DOCUMENTS

| | | | |
|---|---|---|---|
| 4,339,784 | 7/1982 | Shearer | 361/403 |
| 4,835,345 | 5/1989 | Haarde | 174/68.5 |
| 5,067,042 | 11/1991 | Nagano | 361/406 |
| 5,242,100 | 9/1993 | Weeks | 228/180.1 |
| 5,243,143 | 9/1993 | Throop et al. | 174/263 |
| 5,446,244 | 8/1995 | Kawanabe et al. | 174/261 |

OTHER PUBLICATIONS

D. A. Elliott, "Wave Soldering Concerns for Surface Mount Assemblies", *Circuit World*, vol. 15, No. 4 (1989). pp. 25–27.

*Brazing and Soldering*, No. 9 (Autumn 1989).

*Primary Examiner*—Laura Thomas
*Attorney, Agent, or Firm*—Blakely, Sokoloff, Taylor & Zafman

[57] ABSTRACT

The formation of solder bridges between pads on circuit boards is minimized by a process and structure for wicking excess solder deposited during a wave soldering process. Solder thieves are placed adjacent to a last pad of a series of pads and are approximately the same width and twice the length as the pad in order to provide sufficient wicking of solder. Thus, the excess solder is formed on the solder thieves and solder bridges are prevented.

5 Claims, 5 Drawing Sheets

| Solder Thieves Preferred | A | B |
|---|---|---|
| No | >= .100" | >= .100" |
| Yes | >= .100" | < .100" |
| Yes | < .100" | >= .100" |
| Yes | < .100" | < .100" |

PROCESS AND STRUCTURE FOR A SOLDER THIEF ON CIRCUIT BOARDS

BACKGROUND OF THE INVENTION

1. FIELD OF THE INVENTION

The present invention relates to the method of preventing solder bridges incurred during wave soldering of components to a circuit board. More particularly, the present invention relates the generation and utilization of solder thieves to minimize the number of solder bridges that occur during wave soldering of components to a circuit board.

2. ART BACKGROUND

Wave soldering is a process by which melted solder is flowed over a surface of a circuit board to concurrently provide solder to a multiplicity of pads on the surface of the circuit board. The wave soldering process consists of flowing melted solder over the surface of the circuit board in waves, such as running the surface of the circuit board across the surface of a small bath of solder. The advantage to this process is speed; however, solder bridges may form between pads. The solder bridges typically occur between the last two pads of a sequence or row of pads. In the past the distance between pads has been large enough to prevent bridges, however, as circuit densities become greater and the center-to-center pin spacing (pin pitch) becomes smaller, there is a greater potential to form bridges.

To repair the solder bridges that are formed during the wave solder process, operators will manually remove the bridge using a soldering iron and solder wick, or a desoldering iron. However, when manufacturing large lots of boards this process can be quite cumbersome, time consuming, and costly. Therefore, it is desirable to provide a technique for minimizing the number of solder bridges that occur during the wave solder process.

SUMMARY OF THE INVENTION

In the method and apparatus of the present invention, the surface of the circuit board is provided with additional pads that function as solder thieves to minimize solder bridges that occur during the wave solder process. During the wave solder process a surface of a circuit board is moved through a wave solder apparatus which contacts the surface with melted solder. Typically, the circuit board is placed into a feed mechanism such as a chain conveyor, a conveyor belt or the like. Thus, the boards travel through the wave solder in a determined direction. In one embodiment of the present invention a solder thief comprises an approximately rectangular shaped pad that touches the edge of the last pad of a sequence of pads such as pads to which a component is attached. The length of the pad is oriented in the direction of the flow of solder. As the likelihood for solder bridges occurring typically occur between the last set of pads of a sequence of pads, the dimensions of the solder thief enables the solder thief to function to automatically wick the excess solder from the last two pads and prevent a solder bridge from forming between the last pad and next-to-last pad.

This process can be used for surface mount (SMT) pads as well as pads provided for through hole connections. However, for surface mount pads an additional problem is the minimization of clumps of solder on the pads which hinder automated test equipment probes during subsequent testing. Therefore, for surface mount pads that are processed through a wave solder apparatus, the solder thieves used include two pads separated from the last pads by a short distance. These pads are parallel to each other and adjacent to the last pad, such that excess solder is wicked away from the last pad minimizing the possibility of solder bridges and, therefore, electrical shorts and the excess solder is distributed between the two pads, minimizing clumps of solder which interfere with automated test equipment probes.

BRIEF DESCRIPTION OF THE DRAWINGS

Objects, features, and advantages of the present invention will be apparent to one skilled in the art from the following detailed description in which.

DETAILED DESCRIPTION OF THE INVENTION

In the following description for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention unnecessarily.

Figure 1A:
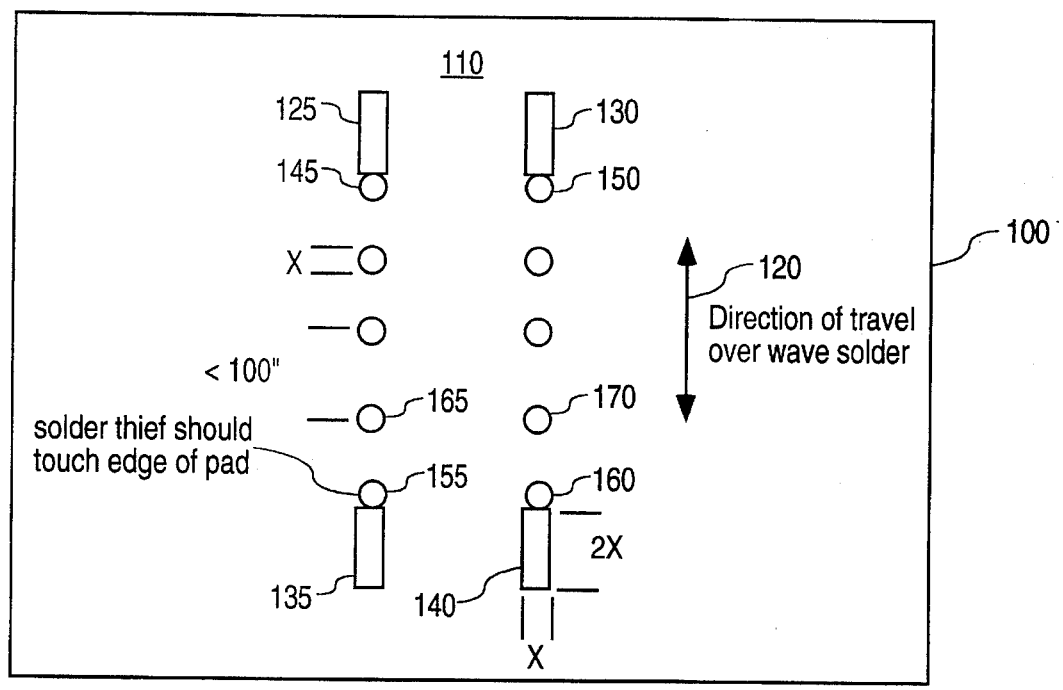
FIG. 1A illustrates a solder thief used for through hole pads on a circuit board.

FIG. 1A illustrates one embodiment of the present invention. Referring to FIG. 1A, a circuit board 100 includes the layout of through hole connections for a through hole component 110. As shown, the direction 120 of travel of the circuit board 100 over the wave solder can be performed in two directions, and solder thieves 125, 130, 135, and 140 are provided at the end pads 145, 150, 155, and 160, respectively, relative to the direction 120 of travel of the circuit board over the wave solder machine. The solder thieves 125, 130, 135, and 140 are provided at the end of the sequence of pads, adjacent to the last pad, as it has been determined that excess solder will form a solder bridge between the last two pads of such a sequence of pads when processed through a wave solder machine. For example, without the solder thieves, solder bridges may form between the last pad 155 or 160, and the next adjacent pad 165, 170, respectively.

The solder thieves 125, 130, 135, and 140, function to wick away the excess solder from pads 145, 150, 155 and 160, respectively, so that no solder bridges are formed, thereby, saving cost and labor for manual repair of solder bridges. The excess solder forms on the solder thieves 125, 130, 135, and 140 or a solder is formed between a solder thief and the adjacent pad, for example, between pad 145 and solder thief 125. However, solder bridges between the solder thief and pad do not cause signal shorting problems as the solder thief is not electrically connected to other pads or electrical interconnects.

Figure 1B:
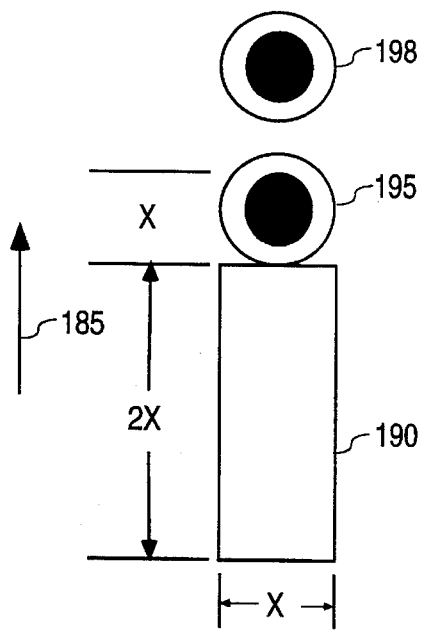
FIGS. 1B and 1C illustrate close-up views of a through hole and embodiments of a solder thief.

A close-up of a through hole pad and solder thief is shown in FIG. 1B. The direction of travel 185 is shown to illustrate that the solder thief 190 is located subsequent, relative to the travel through the wave solder apparatus, of the pad 195. Thus, as the circuit board travels through the wave solder apparatus, the excess solder is then wicked by solder thief 190 such that a bridge is not generated between the last pad 195 and the adjacent pad 198 in the series of pads.

FIG. 1A shows solder thieves that are placed at both ends 125, 130 and 135, 140 of the sequence of pads, as the board may be placed in two directions of travel over the wave solder. Furthermore, if panels of multiple circuit boards (referred to as multipak panels) are manufactured, the boards manufactured on the same panel are typically mirror images of each other; therefore it is desirable that the solder thieves are located at both ends of a sequence of pads. However, if the board is to be placed only in a singular direction of travel, and the boards are not manufactured on multipak panels, a second set of pads at the opposite end of the sequence of pads would not be necessary, and the solder thieves would be placed only adjacent to the last set of pads relative to travel through the wave solder.

In the present embodiment, as shown in FIGS. 1A and 1B, the solder pad is defined to be of a diameter X. The length of the solder thief must be significantly longer, preferably at least 1.5 to 2 times longer, than the solder pad in order to provide sufficient wicking action in view of the direction of travel of the solder flow. In this embodiment, in order to provide the proper wicking action, it is preferred that the solder thief have a width X, and a length 2X, to provide sufficient surface tensions to perform the wicking action. The solder thieves are preferably constructed using the same techniques and materials utilized to form the pads. Such techniques and materials are well known in the art and will not be discussed in detail herein. However, it is readily apparent to one skilled in the art that other techniques and materials can be used to form the solder thieves.

The size of the solder thief is preferably the dimensions shown, however, it is readily apparent to one skilled in the art that the size and shape must be sufficient to pull enough solder away to eliminate the formation of a solder bridge between adjacent pads. In the through hole pad embodiment, such as is illustrated in FIG. 1A and 1B, it is preferred that the solder thief touches the edge of the pad, although it is not necessary for the solder thief to operate to wick away the excess solder from the pad. However, the distance between the last pad and the solder thief must be shorter than the distance between pads. More particularly, on a circuit board with 50 mil center to center spacing, the thief can be placed only a maximum of 0.006" away from the last pad and still function to wick away excess solder from the last two pads. Furthermore, in the present embodiment, it is preferred to eliminate the possibility of a signal trace being placed between the pad 195 and the solder thief 190. If a trace is placed between the pad 195 and the solder thief 190, the trace provides a barrier of a height which the solder may not be able to flow over. Therefore, the thief may not work, causing a bridge between the last two pads.

It has been found that for through hole components that are less than 100 mils (¹/₁₀ of an inch) apart, solder thieves are desirable. For components with greater than 100 mils pitch, solder thieves, as described herein, are useful but not mandatory, as the center-to-center spacing (i.e., the pitch) is sufficiently large to minimize the occurrence of solder bridges. However, with higher densities having a pitch less than 100 mils, the problem of formation of solder bridges is significant.

Figure 2:
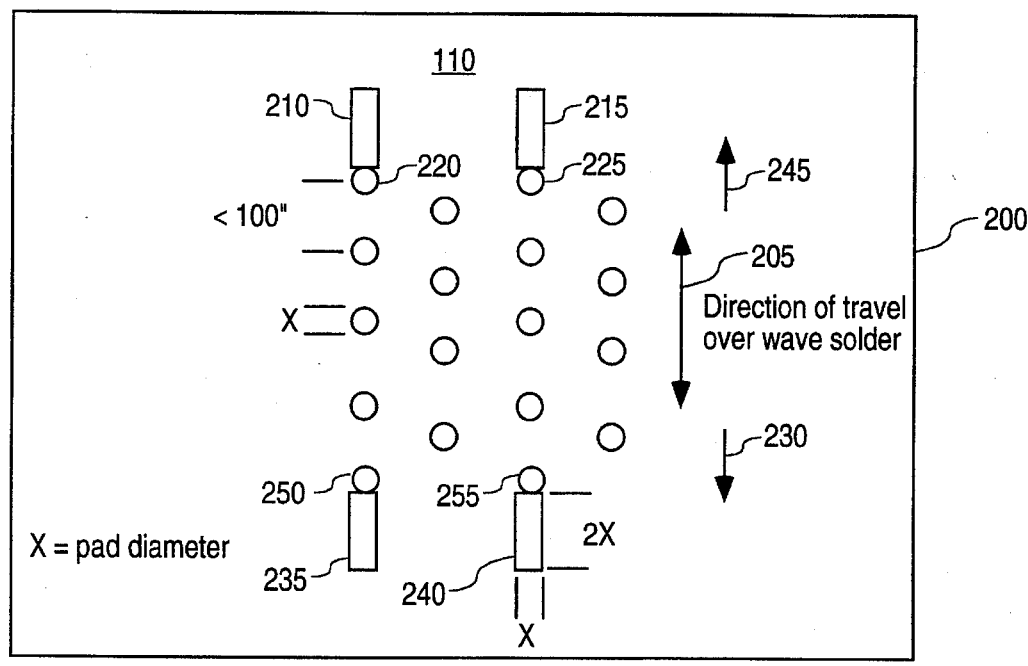
FIG. 2 is another example of a through hole pad design and solder thieves utilized to minimize solder bridges during wave solder.

Solder thieves operate with different formations of through hole patterns such as the staggered pattern shown in FIG. 2. Again, the circuit board 200 can be processed in two different directions 205 through a wave solder apparatus, as a first set of solder thieves 210, 215 is utilized to wick away excess solder from pads 220, 225 when the board 200 is processed in the first direction 230 through the wave solder apparatus, and a second pair of thieves 235, 240 are utilized for the second direction 245 to wick away excess solder from the last set of pads 250, 255, in the sequence of pads on the circuit board 200.

Figure 1C:
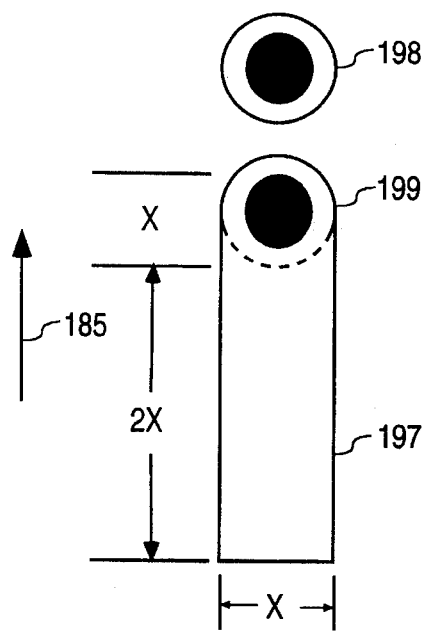

An alternate embodiment of a solder thief of the present invention is illustrated in FIG. 1C. In this embodiment, the solder thief 197 is formed an extension of the last pad 199, and provides sufficient wicking action to prevent a solder bridge from forming between the last pad 199 and the adjacent pad 198.

Figures 3A, 3B:
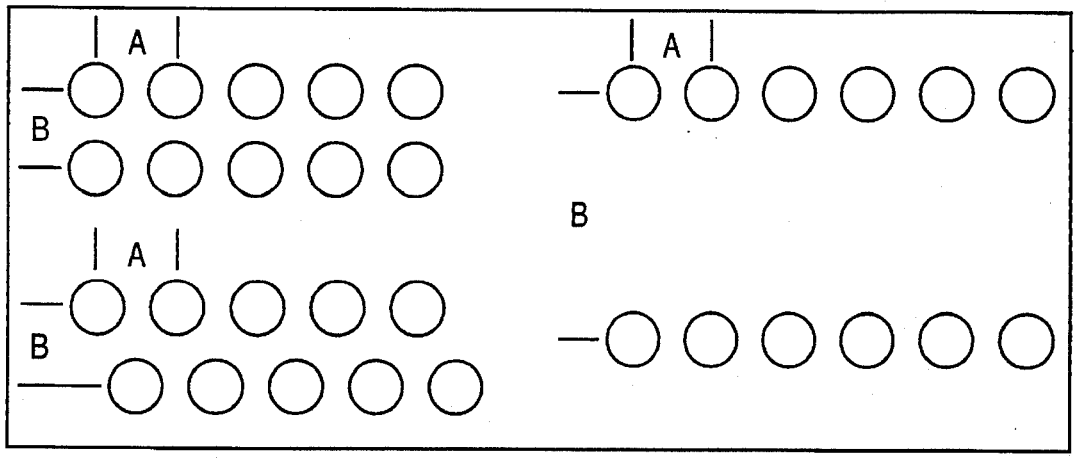
FIG. 3A provides a close-up of pads and dimensions.
FIG. 3B identifies dimensions in which the use of solder thieves is preferred.

FIGS. 3A and 3B provide examples of dimensions and layouts in which it has been found that solder thieves provide assistance in preventing solder bridges which may occur during the wave solder process of high density circuit boards.

In an alternate embodiment, solder thieves are provided to wick away excess solder that may be deposited on surface mount pads. Surface mount pads are different from through hole pads as they encompass more surface area and require more solder on the surface of the circuit board. More particularly, the pitch is smaller than through holes, typically 0.050". Therefore, the likelihood of greater amounts of excess solder being deposited and solder bridges forming is more significant. It has been found that the solder thief should be bigger than the pad that the excess solder is to be wicked from. In particular, the length of the solder thief must be longer than the length of the pad, preferably 1.5 to 4 times the length of the pad. Furthermore, the solder thief must touch or be closer to the last pad than the pad to pad spacing of the component. In particular, the solder thief must be no further than 0.006" away from the last pad.

Figure 4A:
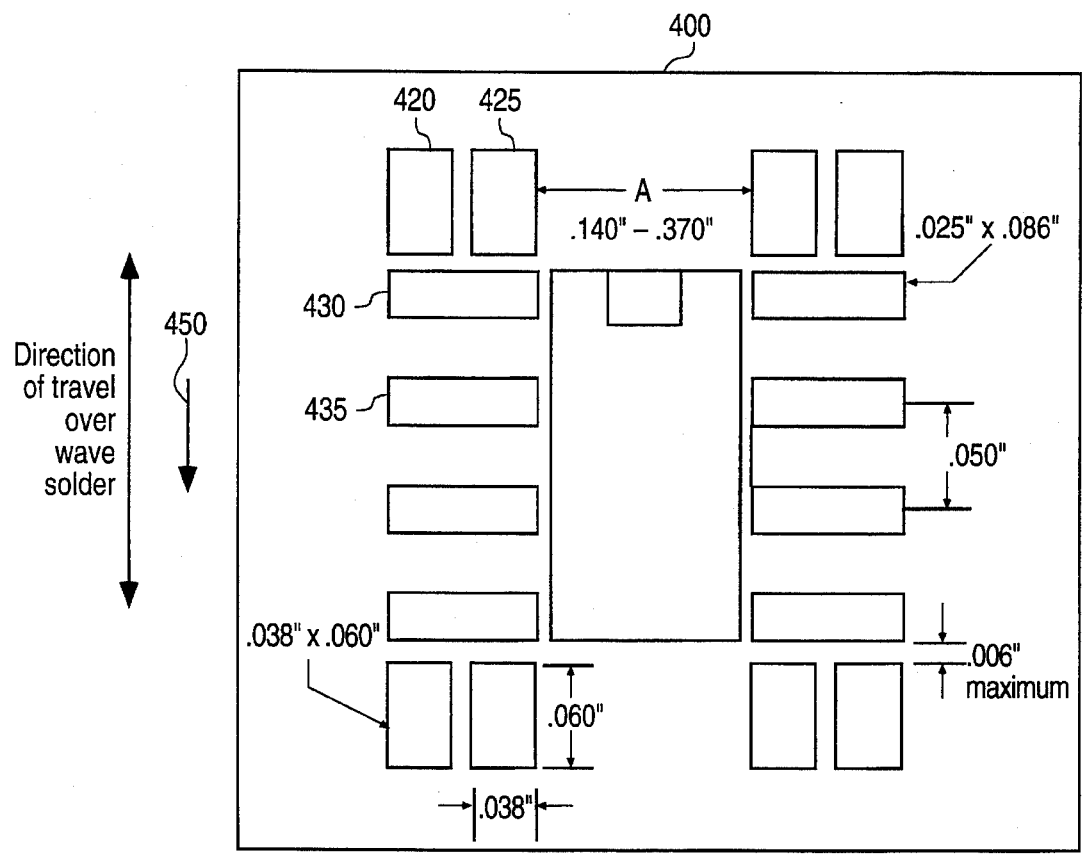
FIGS. 4A and 4B show alternate embodiments of the present invention in which the solder thieves are configured to be used with surface mount pads.
Figure 4B:
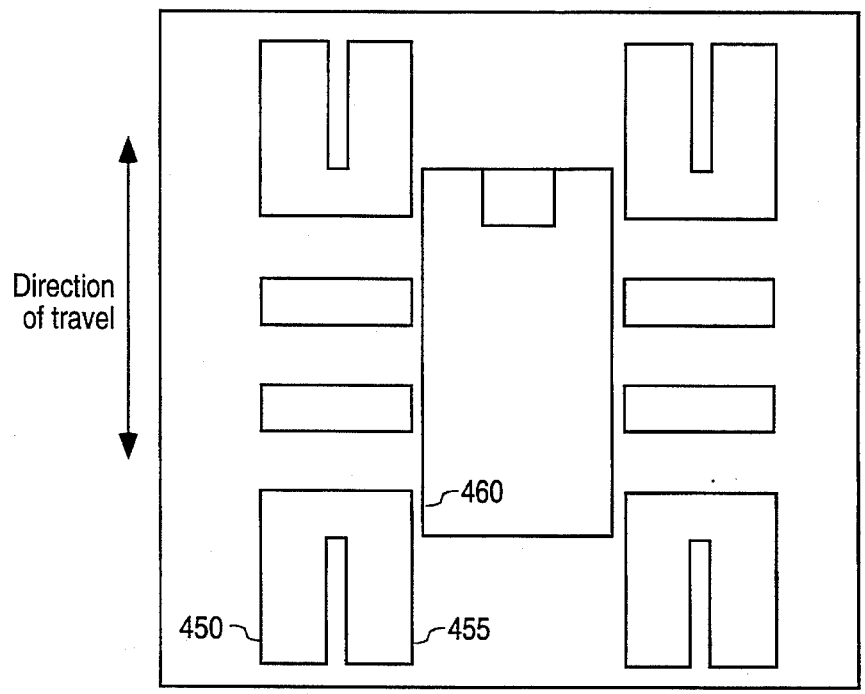

In the embodiment shown in FIG. 4, the solder thieves (i.e., solder thieves 420, 425) wick away excess solder from pad 430 when the circuit board 400 is processed through a wave solder apparatus in a first direction 450. The solder thieves 420, 425 are of a dimension that is approximately the same width of the pad 430, and about approximately 2 to 3 times the length of the pad 430. To minimize the formation of mounds of solder which inhibit the movement of probes of automated test equipment, the solder thieves are separated by a small space. The space is large enough to minimize the formation of one large mound of solder but small enough to not inhibit the wicking effect. In the present example, the space is approximately 0.006" of an inch. In the embodiment shown in FIG. 4A, for example, the width of the pad 430 is 0.086 inches. The solder thieves cumulatively have a width of 0.076 inches with a 10 mil (0.01 inch) spacing between the solder thieves 420, 425. The length of the pad is 0.025 and the length of the solder thieves 420, 425, is approximately 2½ times the size of the length of the pad; in this case 0.060 inches. In the embodiment shown in FIG. 4A, a gap of approximately less than 0.006 inches is provided between solder thieves 420, 425 and pad 430. FIG. 4B shows a second embodiment in which the spacing is eliminated and the solder thieves 450, 455 are an extension of the last pad 460.

Figure 5:
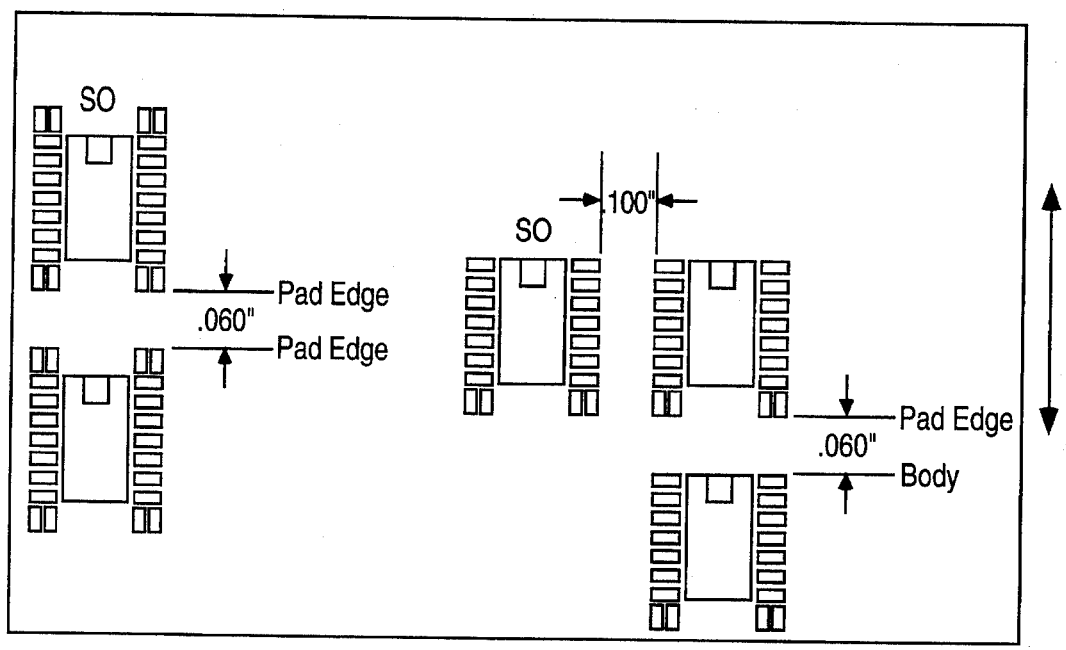
FIG. 5 illustrates the spacing that can be utilized when employing the solder thieves of the present invention to surface mount pads.

FIG. 5 illustrates an additional advantage achieved using the solder thieves of the present invention. The utilization of the solder thieves enable closer spacing between layouts of components. As shown, a 60 mil spacing may be provided without the detrimental effects of solder bridges being formed.

Figure 6:
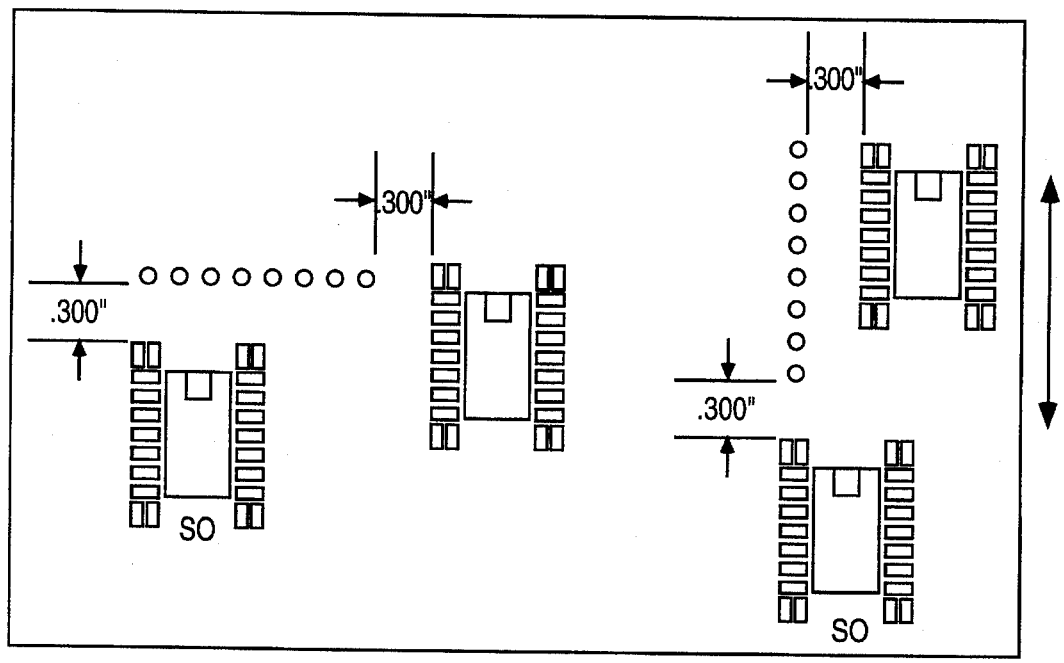
FIG. 6 is another illustration illustrating clearances that are enabled by utilizing solder thieves on surface mount pads in accordance with the teachings of the present invention.

Similarly, as shown in FIG. 6, 300 mil spacing between through holes and surface mount pad layouts can be accomplished without the concern for the formation of solder bridges.

The invention has been described in conjunction with the preferred embodiment. It is evident that numerous alternatives, modifications, variations, and uses will be apparent to those skilled in the art in light of the foregoing description.

What is claimed is:

1. A circuit board that is processed through a wave solder machine in a direction to apply solder to a first surface of the circuit board, said circuit board comprising:

a plurality of pads on the first surface, said pads arranged in a first sequence delineated by a first pad and a last pad, said first pad and last pad identified in accordance with the direction the board is processed through the wave solder machine and therefore the sequence solder is placed on the pads by the wave solder machine;

at least one solder thief located at the end of the first sequence of pads, adjacent to the last pad, said solder thief having a larger surface area than the last pad such that when the circuit board is processed through a wave solder machine in the direction, said solder thief wicking excess solder from the last pad and a next-to-last pad adjacent to the last pad to the solder thief such that a solder bridge between the last pad and next-to-last pad is not formed; and wherein the last pad is circular in shape and comprises a through hole in which pins of a component are inserted, said solder thief is approximately rectangular shape having a width at least approximately the same as the diameter of the last pad and a length approximately twice the diameter of the last pad.

2. The circuit board as set forth in claim 1, wherein an edge of the solder thief touches an edge of the last pad.

3. The circuit board as set forth in claim 1, wherein the solder thief is formed as an extension of the last pad.

4. A method for constructing pads on a surface of a circuit board to which components are subsequently attached and soldered using a wave solder machine, said surface processed through the wave solder machine in a determined direction, said method comprising the steps of:

generating a layout of pads on the surface of the circuit board to which components are attached, said pads constructed of material to which solder adheres;

determining from the layout sequences of pads, delineated by a first pad and a last pad, said first pad and last pad identified in accordance with the direction the board is processed through the wave solder machine and therefore the sequence solder is placed on the pads by the wave solder machine;

placing a solder thief at the end of the first sequence of pads adjacent to the last pad, said solder thief having a length at least 1.5 times longer than the length of the last pad and a larger surface area than the last pad;

processing the circuit board through the wave solder machine in the direction;

said solder thief wicking excess solder from the last pad and a next-to-last pad adjacent to the last pad to the solder thief such that a solder bridge between the last pad and next-to-last pad is not formed; and wherein the last pad is circular in shape and comprises a through hole in which pins of a component are inserted, said solder thief is approximately rectangular in shape having a width at least approximately the same as the diameter of the last pad and a length approximately twice the diameter of the last pad.

5. The method as set forth in claim 4, wherein said step of placing a solder thief comprises forming the solder thief as an extension of the last pad.

* * * * *